(12) United States Patent
Shin

(10) Patent No.: US 6,214,116 B1
(45) Date of Patent: Apr. 10, 2001

(54) HORIZONTAL REACTOR FOR COMPOUND SEMICONDUCTOR GROWTH

(75) Inventor: Hyun Keel Shin, Taejon (KR)

(73) Assignee: Hanvac Corporation, Taejon (KR)

( * ) Notice: Subject to any disclaimer, the term of this patent is extended or adjusted under 35 U.S.C. 154(b) by 0 days.

(21) Appl. No.: 09/232,554

(22) Filed: Jan. 18, 1999

(30) Foreign Application Priority Data

Jan. 17, 1998 (KR) .................................................. 98-1328

(51) Int. Cl.[7] .......................................................... B05B 5/00
(52) U.S. Cl. .............................................. 118/640; 118/715
(58) Field of Search .................................... 118/730, 725, 118/715, 640, 55; 156/345

(56) References Cited

U.S. PATENT DOCUMENTS

| 3,750,620 | * | 8/1973 | Eversteijn et al. | 118/48 |
| 4,991,540 | * | 2/1991 | Jurgensen et al. | 118/715 |
| 5,029,554 | * | 7/1991 | Miyashita et al. | 118/715 |
| 5,443,647 | * | 8/1995 | Aucoin et al. | 118/723 ME |
| 5,855,680 | * | 1/1999 | Soininen et al. | 118/719 |

FOREIGN PATENT DOCUMENTS

| 9736320 | 2/1997 | (JP) . | |
| 10167897 | * | 6/1998 | (JP) | C30B/29/38 |
| 56134731 | 10/1981 | (WO) . | |

OTHER PUBLICATIONS

Shuji Nakamura et al. "Novel Metalorganic Chemical Vapor Deposition System for GaN Growth", May 1991.
Tomohiro Nakamori "LED Brightness Boosted for Full Color Displays," Jan. 1997.
Article by Shuji Nakamura et al., entitled: "Novel metalorganic chemical vapor deposition system for GaN growth." May 1991.
Article by Tomohiro Nakamori, entitled "LED Brightness Boosted for Full Color Displays." Jan. 1997.

\* cited by examiner

*Primary Examiner*—Gregory Mills
*Assistant Examiner*—Luz Alejandro
(74) *Attorney, Agent, or Firm*—Baker Botts L.L.P.

(57) ABSTRACT

Described is a horizontal reactor for processing GaN based semiconductors which achieves high quality epitaxial growth because no dust is produced through use of a ferrofluidic power transmission or gas flow to rotate its susceptor, elements from thermal decomposition of ammonia gas are provided separately at high temperatures at a position proximate the substrate so that premature reaction between ammonia ions and the reactant gases is avoided, and the reactor is constructed to suppress thermal convection attributed to heat from the susceptor which otherwise hinders smooth epitaxial growth.

8 Claims, 15 Drawing Sheets

HORIZONTAL REACTOR FOR COMPOUND SEMICONDUCTOR GROWTH

FIELD OF THE INVENTION

The present invention is related to a reactor for processing semiconductors, and in particular to a horizontal reactor for GaN based semiconductors.

BACKGROUND OF THE INVENTION

Compound semiconductor products have been used in emitting diodes for displays, optical telecommunications equipment, laser diodes (LD) for compact/video discs (CD/VD), photoconductors, capacitors for high speed computers, capacitors for satellites, and the like. The use of compound semiconductor products is being extendeded to mobile telecommunications equipment, blue laser diodes for optical digital displays (ODD), capacitors for optical computers, and the like.

Light emitting diodes (LED) used for color image, graphic display elements provide a full color display through a combination of the three basic colors, red, green and blue. Among these, blue LED is manufactured from III–V nitrides, AlN, GaN, InN, and the like, and have emitting wavelengths of about 450 nm. $(Al_xGa_{1-x})_{1-y}In_yN$ has a direct energy band structure in the range of $(1 \geq x \geq 0)$ and $(1 \geq y \geq 0)$, and has the advantage of adjusting the band gap from 2.0 eV up to 6.2 eV (wavelength range, 370–650 nm) with the variations in x and y variables providing the ability to realize various colors with a single material.

Metal Organic Chemical Vapor Deposition (MOCVD) systems are generally used in processing III nitride materials. MOCVD systems are divided into two basic groups by the arrangement of the reactor types, horizontal reactors and vertical reactors.

Vertical reactors are generally equipped with a rotating mechanism for susceptors and are inferior in terms of uniformity in epitaxial growth due to a speedy flow of source gases on the periphery of the substrate. In contrast, horizontal reactors are advantageous for obtaining uniformity due to laminar flow formation of source gases parallel with the substrate. In spite of this, conventional horizontal reactors are still weak in suppressing thermal convection resulting in limitations on the formation of a uniform epitaxial growth. Although horizontal reactors employing rotating suceptors for improving uniformity are known, they have the disadvantage of producing dust from gear friction and insufficient prevention of thermal convection even with the employment of such rotating mechanisms.

Prior art publications for GaN based semiconductor processing techniques include T. Nakamori, Nikkei Electronics Asia, 6(1), 57(1997); M. Kamp, Compound Semiconductor, 2(5), 22 (1996); I. Bhat, Compound Semiconductor, 2(5), 24(1996); S. Nakamura, Microelectronics, J., 25(8), 651 1994); and S. Strite and H. Morkoc, J. Vac. Sci. Technol., R10(4), 1237(1992).

SUMMARY OF THE INVENTION

An object of the invention is to provide an improved horizontal reactor for GaN based semiconductors which provide a solution to the above-stated problems in the art, and which achieve uniform epitaxial growth.

The above and other objects are accomplished by providing a horizontal reactor for compound semiconductor growth which comprises a susceptor adapted to hold a substrate on which a thin film for a semi-conductor grows, and an inner cell having an upper wall, a base wall and side walls. The upper wall, base wall and side walls define a reactant gas passage having two open ends. The upper wall has an inclined portion deriving laminar flow for reactant gases in the mid section of the upper wall. The lower wall supports the susceptor in a position opposite to the inclined portion. The reactor further comprises an outer cell surrronding the inner cell, an ammonia supply means for supplying ammonia gas to the reactant gas passage, a reactant gas supply means communicating with a first end of the two ends of the reactant gas passage which supplies reactant gases except ammonia gas to the reactant gas passage, a reactant gas vent means communicating with the second end of the two ends of the reactant gas passage for exhausting reactant gases out of the reactant gas passage, an ammonia gas heating means for heating ammonia gas, and a susceptor heating means for heating the susceptor.

Preferably, the reactor further comnprises a susceptor rotating means for rotating the susceptor.

Preferably, the ammonia heating means and the susceptor heating means are RF (radio frequency) coil heaters. The susceptor has a rotating portion which holds the substrate and is rotated by the susceptor rotating means and a stationary portion which surrounds the rotating portion. The ammonia supply means has an ammonia supply tube, one end of which is open at a position adjacent the rotating portion of the susceptor. The ammonia supply tube is installed through the stationary portion of the susceptor so that it is heated as the stationary portion is heated.

Preferably, a long groove extends around the substrate on an upper surface of the stationary portion of the susceptor. The end of the ammonia supply tube is connected to the groove.

Preferably, the susceptor rotating means comprises a ferrofluidic power transmission which connects the susceptor to a susceptor driving motor.

Preferably, the ammonia supply means has an ammonia supply tube, one end of which is open at a position of the base wall of the inner cell adjacent the susceptor. The ammonia heating means comprises an electric resistance heater which surrounds the ammonia supply tube and the susceptor heating means comprises an electric resistance heater positioned below the susceptor.

Preferably, the inner cell has a tube-type injector which projects downwardly from the base wall of the inner cell and receives the ammonia supply tube. The tube-type injector has a long groove which extends perpendicular to the longitudinal axis of the inner cell at the portion of the injector at which the injector meets with the base wall of the inner cell.

Preferably, the reactor further comprises a first gas supply means and a second gas supply means which supply gas to the susceptor. The susceptor has a susceptor block supported on the base wall of the inner cell, a central cylindrical portion and a rotating portion. The susceptor block is provided with a recess for receiving the rotating portion and the central cylindrical portion, a first gas supply tube through which flows the gas supplied from the first gas supply means, a second gas supply tube through which flows the gas supplied from the second gas supply means, and outlets for exhausting the gases. The central cylindrical portion is in the shape of a hollow cylinder having an open end fixed to the bottom of the recess, and is provided with a plurality of through holes. The rotating portion has a main body for holding the substrate and a hollow cylindrical portion extending downwards from the lower surface of the main body. The hollow cylindrical portion has a plurality of wings arranged on its outer periphery. The first gas supply tube is connected to the bottom of the recess so that gas supplied through the first gas supply tube fills the space defined by the bottom of the recess and the inside of the central cylindrical portion and flows into a gap between the central cylindrical portion and the hollow cylindrical portion of the rotating portion through the plurality of through holes so that the gas flow exerts a pressure against the surface of the hollow cylindrical portion to lift the rotating portion. The second gas supply tube is connected to the wall of the recess so that gas supplied through the second gas supply tube flows into a space between the hollow cylindrical portion of the rotating portion and the recess of the susceptor block so that the gas impacts against the wings to rotate the rotating portion.

The horizontal reactor of the present invention can achieve high quality epitaxial growth for the following reasons:

(1) No dust is produced by friction among gears because the present suceptor is rotated by a ferrofluidic power transmission or gas flow.

(2) Elements from thermal decomposition of ammonia gas are provided separately and yield nitrogen ions at a temperature of approximately 1,000° C. and the decomposed ammonia gas is supplied at a position proximate the substrate so that premature reaction between ammonia ions and the reactant gases is avoided.

(3) The inner cell is inclined above the suceptor and downwardly toward the gas outlet in order to suppress thermal convection attributed to heat from the suceptor which hinders smooth epitaxial growth.

BRIEF DESCRIPTION OF THE DRAWINGS

The invention is described in detail below in conjunction with the accompanying drawings of which.

DETAILED DESCRIPTION OF THE INVENTION

FIGS. 1–11 depict the first embodiment of the invention. The horizontal reactor of the invention is primarily for use in MOCVD processes for epitaxial growth of compound semiconductors, but can also be used for other similar proceses.

Figure 1:
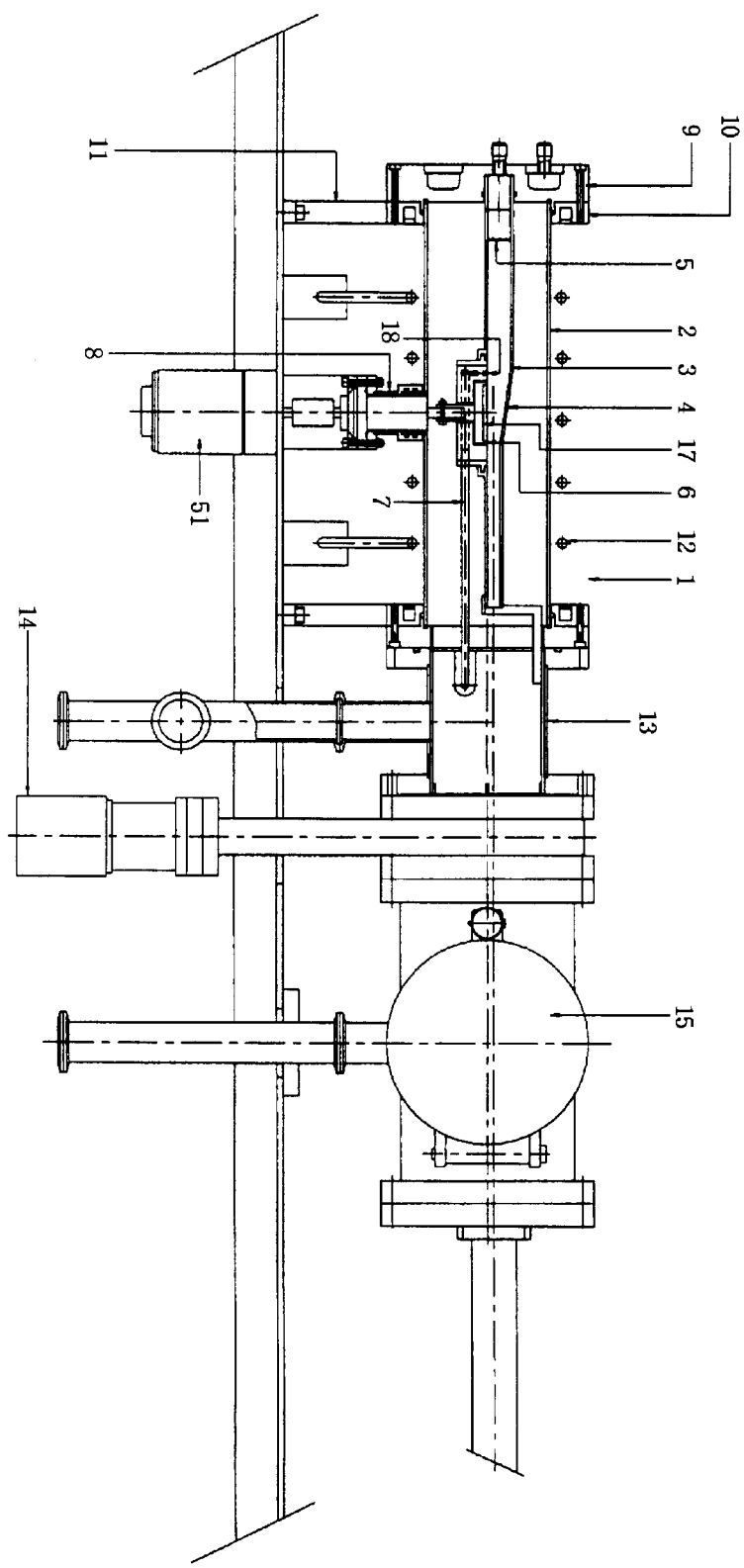
FIG. 1 is a sectional view of the reactor according to the first embodiment of the invention.
Figure 2:
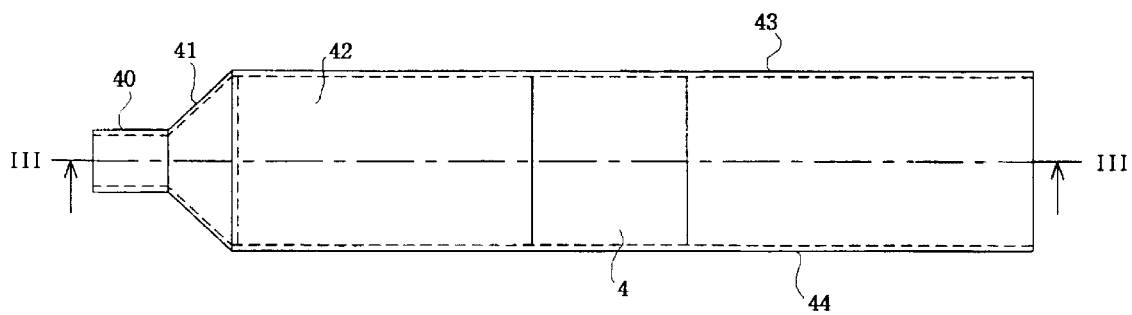
FIG. 2 is a plan view of the inner cell of the reactor of the first embodiment.
Figure 3:
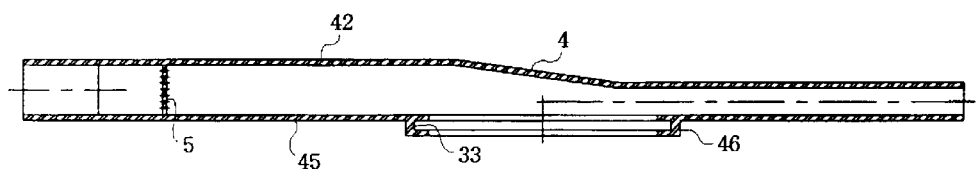
FIG. 3 is a sectional view of the inner cell taken along line III—III in FIG. 2.
Figure 4:
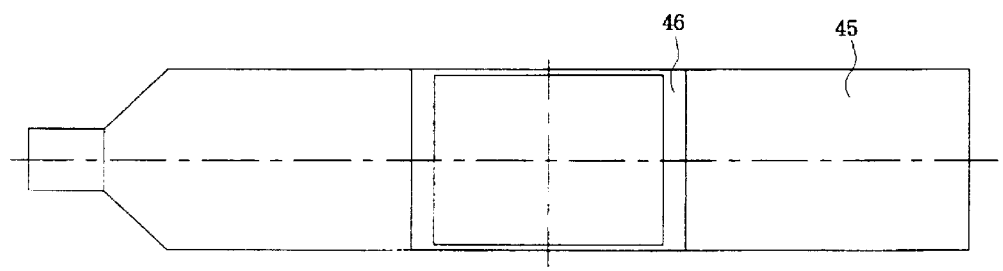
FIG. 4 is a bottom view of the inner cell of the first embodiment.
Figure 5:
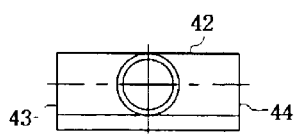
FIG. 5 is a side elevational view of the inner cell of the first embodiment viewed from the left side.
Figure 6:
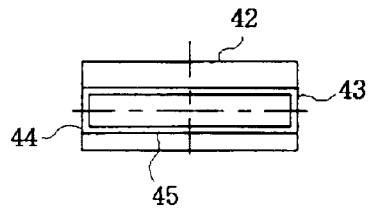
FIG. 6 is a side elevational view of the inner cell of the first embodiment viewed from the right side.
Figure 7:
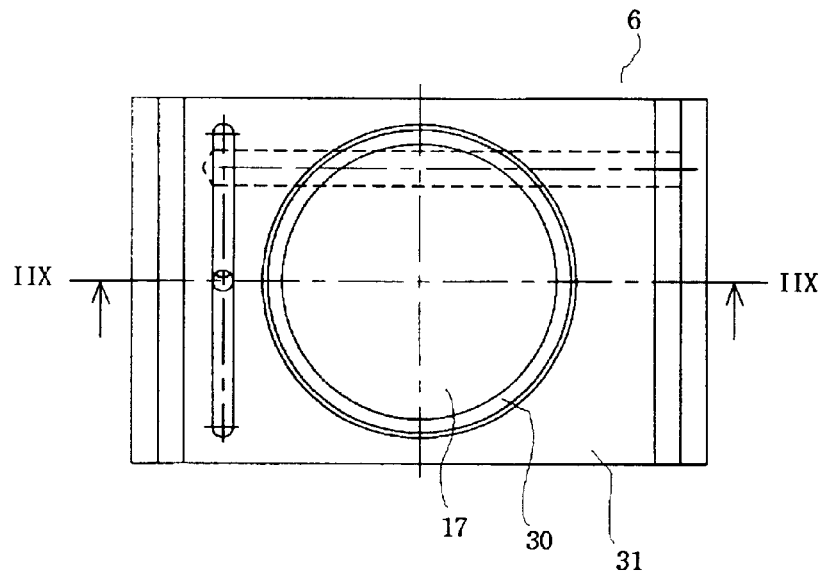
FIG. 7 is a plan view of the susceptor of the first embodiment.
Figure 8:
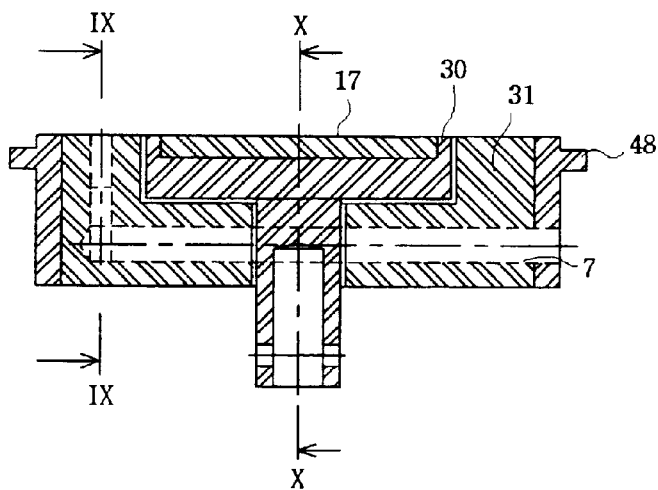
FIG. 8 is a sectional view of the susceptor taken along line IIX—IIX in FIG. 7.
Figure 9:
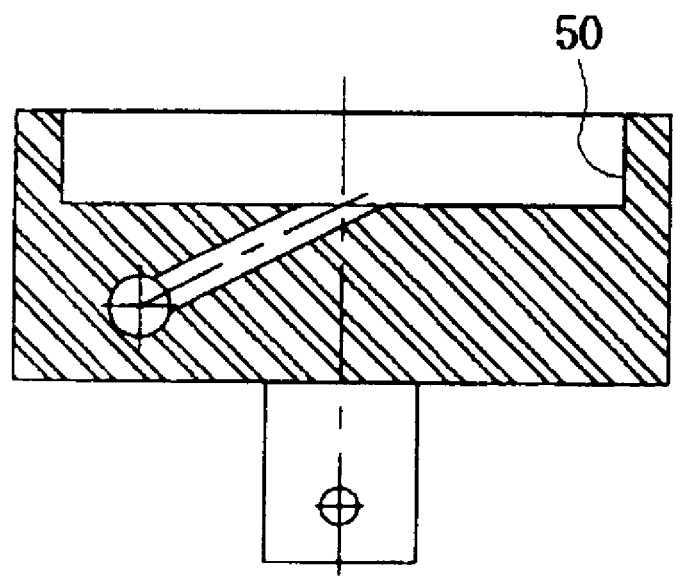
FIG. 9 is a sectional view of the susceptor taken along line IX—IX in FIG. 8.
Figure 10:
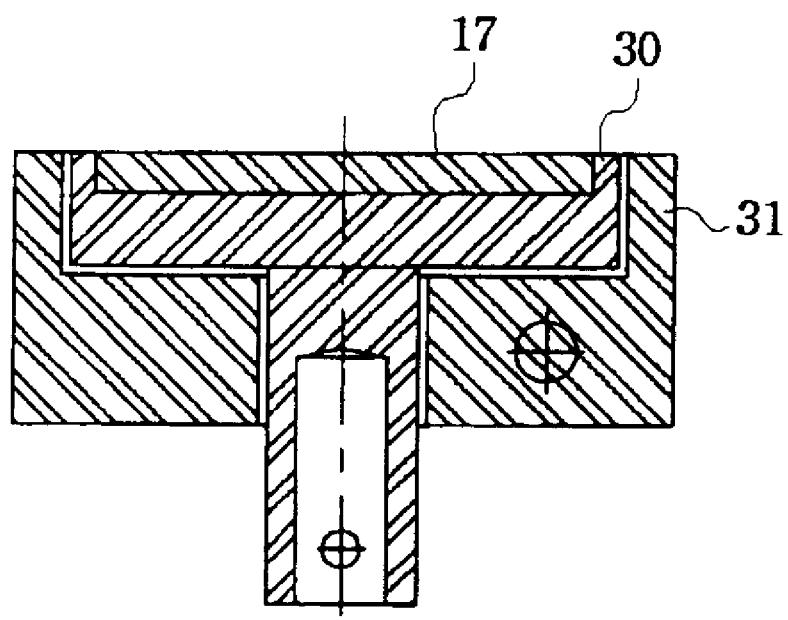
FIG. 10 is a sectional view of the susceptor taken along line X—X in FIG. 8.

FIG. 1 shows a horizontal reactor 1 for GaN-based semiconductor growth. Reactor 1 has an outer cell 2, an inner cell 3 to induce laminar flow of the source gases, a reactant gas supply portion 9, a susceptor 6 to admit a substrate 17, a ferrofluidic power transmission 8 to rotate the susceptor, an RF heater 12 for heating the substrate, and a vent portion 13 to exhaust the reacted gases from the reactor. Reactor 1 is connected to a loading chamber 15 via a gate valve 14.

Outer cell 2 functions to maintain the pressure of the reactant gases and is made from a quartz tube to avoid being heated by RF heater 12 which is wound around the exterior of the outer cell. Outer cell 2 is fixed by a vacuum flange 10 which has a water cooling jacket.

Inner cell 3 is made from a quartz tube to avoid being heated by RF heater 12. One end of inner cell 3 is connected with reactant gases supply portion 9. Inner cell 3 includes a shower head 5 to spray reactant gases and an inclined portion 4 to suppress thermal convection. All reactant gases except ammonia gas flow through shower head 5 which is provided with uniformly distributed holes to spray the gases and mix them with the nitrogen ions yielded by thermal decomposition of ammonia gas just before reaching susceptor 6, and then allowed to flow over the substrate, whereby GaN epitaxial growth is formed on substrate 17 placed on susceptor 6 which has been placed in the mid section of inner cell 3. Substrate 17 may be rotated by susceptor 6 to improve the uniformity of epitaxial growth on the substrate as explained below.

As high temperatures of over 1,000° C. are required during epitaxial growth through a conventional MOCVD process, the reactant gas used (hydride gas) and the MO source do not settle down and instead float over heated substrate 17 due to thermal convection from the high temperatures. Accordingly, if thermal convection is not suppressed, epitaxial growth cannot form uniformly or it may not form at all. Inclined portion 4 is provided in the middle of inner cell 3 in order to eliminate thermal convection and to allow laminar flow to reach the substrate on which the GaN semiconductor growth process occurs, avoiding the adverse effects due to thermal convection from the high temperature of the susceptor. The inclined angle of inclined portion 4 is varied depending on the size of the substrate and drift velocity of the source gases, and is selected to form laminar flows above the substrate. By providing inclined portion 4 opposite the susceptor, the flow of source gases collides with inclined portion 4 and goes downward to the substrate in spite of the heating of source gases by hot substrate 17. Therefore, the inclined portion 4 of the inner cell of the present invention makes it possible to induce source gas flow to be steadily focused onto the substrate thereby increasing the efficiency of the epitaxial growth and reducing the loss of sources adhered to the inner cell near the substrate.

FIGS. 2–6 show the inner cell of the horizontal reactor for compound semiconductor processing pursuant to the present invention. The inner cell comprises a gas inlet 40 in the shape of a cylinder which admits the reactant gases supplied from gas supply portion 9 into the reacting space defined by the inner cell. Gas supply portion 9 supplies all reactant materials except ammonia ions. The inner cell also comprises a base wall 45 having a supporter 46 supporting the susceptor, an upper wall 42 having inclined portion 4 located above the susceptor, and side walls 43 and 44 connecting upper wall 42 and base wall 45. These walls constitute a rectangular channel for flow of all reactant gases. A diffusion area 41 links gas inlet 40 with the channel. Reactant gases are sprayed through shower head 5 at a position where the channel begins to pass diffusion area 41. Supporter 46 projects outwards from around the middle part of base wall 45 and is provided with grooves 33 into which projections 48 of the susceptor are adapted to be inserted (further details are provided below). Inclined portion 4 of upper wall 42 is positioned opposite the substrate on the susceptor supported by supporter 46. The source (reactant) gases flow over the substrate and are then exhausted through the outlet end of the inner cell, which is positioned opposite gas inlet 40.

A gas such as hydrogen is allowed to flow in the space between inner cell 2 and outer cell 3. The gas flow maintains the pressure of reactant gases inside inner cell 2. The hydrogen gas flowing out of the space meets and mixes with the reacted gases coming out of inner cell 2. All mixed gases are then exhausted from the reactor through vent portion 13 driven by a pump (not shown in the drawings). Accordingly, the pressure required for the reaction is kept constant and the source gases are supplied continuously into the reactor.

FIGS. 7–10 depict susceptor 6 of the horizontal reactor for compound semiconductors of the present invention. Susceptor 6 comprises a rotating portion 30 to support as well as rotate substrate 17, and a stationary portion 31 surrounding the rotating portion 30. To the ends of stationary portion 31 are attached side walls 47. Each of the side walls 47 has a projection 48 adapted for insertion into groove 33 in supporter 46 of inner cell 3. Preferably, the gap between rotating portion 30 and stationary portion 31 is made as small as possible, for example about 1 mm, which takes into consideration the ease of machining of suceptor 6. An ammonia gas supply tube 7 is positioned longitudinally through stationary portion 31. Ammonia gas supply tube 7 is connected to a long recess 50 by an inclined tube. Recess 50 is positioned at the end of stationary portion 31, which is directed toward reactant gas supply portion 9 when stationary portion 31 is installed in inner cell 3. In this manner, ammonia ion is supplied to the inside of inner cell 3 through tube 7 and recess 50.

Figure 11:
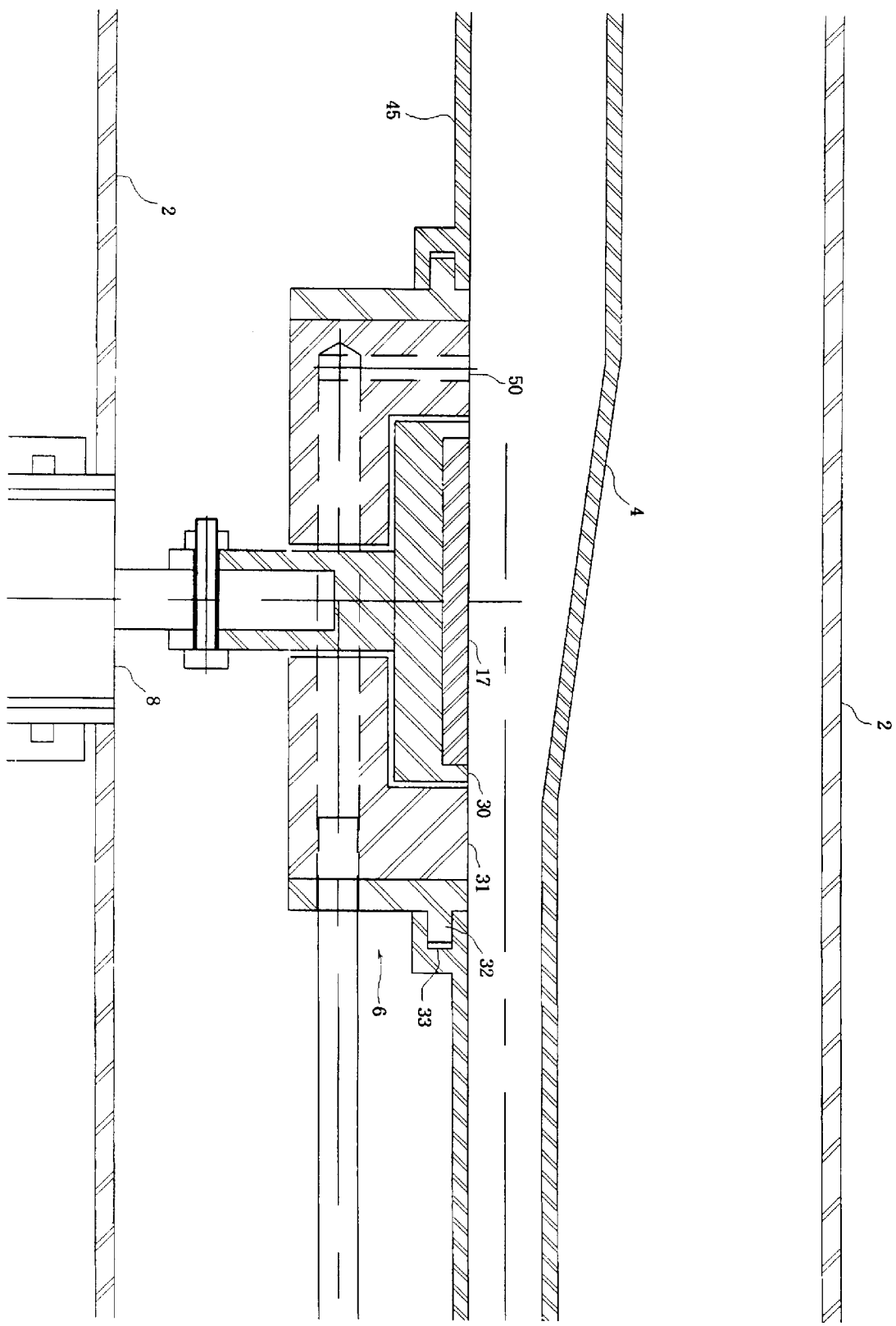
FIG. 11 is an enlarged sectional view of the susceptor and a portion of the inner cell around the susceptor of the first embodiment.

FIG. 11 shows susceptor 6 assembled in the reactor in detail. Rotating portion 30 of susceptor 6 is rotated to improve the uniformity of epitaxial growth quality including the thickness of the epitaxial layer which grows on the substrate. Rotating portion 30 is connected with a ferrofluidic power transmission 8 driven by a motor 51. In this way, proper rotation and vacuum sealing are achieved. The rotating portion of susceptor 6 and substrate 17 laid thereon are positioned substantially flush with base wall 45 of inner cell 3. Rotating portion 30, stationary portion 31 and side walls 32 of susceptor 6 are made of graphite and coated with SiC (silicon carbide). Susceptor 6 is heated in its entirety with an RF induction heater which coils around the outer cell. As the susceptor is heated, the ammonia gas tube installed at stationary portion is also heated, ammonia gas is decomposed into nitrogen ions which are sprayed through recess 50. Recess 50 is made wider than the diameter of substrate 17 to make the nitrogen ion flow over the substrate uniform. Since recess 50 is positioned proximate to substrate 17, the nitrogen ion flow is formed directly over substrate 17 and consequently increases the density of nitrogen ions to satisfy GaN based epitaxial growth. Further, the stay time of nitrogen ions in the reaction space is shortened and restoration to ammonia gas is decreased. The flow of nitrogen ions is further forced toward the substrate by the flow pressure of the reactant gases exiting from shower head 5 and consequently the density of nitrogen ions onto the substrate is further increased.

The disclosure up to now has been on the first embodiment of the horizontal reactor for processing compound semiconductors of the present invention. The reactor of the first embodiment has the merit of simple construction as the ammonia gas tube is integral with the susceptor. As the susceptor and ammonia gas are heated together at the same time with an RF induction heater wound around the outer cell, the necessity for installing heaters inside the outer cell is avoided.

FIGS. 12–18 show the second embodiment of the horizontal reactor of the present invention. In the horizontal reactor shown in FIG. 12, the ammonia supply tube is not disposed inside the susceptor but connected to the reaction space inside the inner cell as a separate supply tube. The susceptor and the ammonia gas tube are heated separately by its own dedicated heater. In the first embodiment, both susceptor and ammonia gas tube are heated by one RF heater at the same time at the same temperature (for example, 800° C.). In the second embodiment, the temperature for decomposition of ammonia gas is controlled at about 1000° C. and the temperature of the susceptor is controlled at a suitable temperature below 1000° C. by two separate heaters and more appropriate conditions for the reaction inside the inner cell can be obtained.

The horizontal reactor of the second embodiment is provided in more detail with reference to FIGS. 12–18. For elements which are used in common with the first embodiment, the same reference numerals are applied and their details are omitted hereinbelow.

Figure 12:
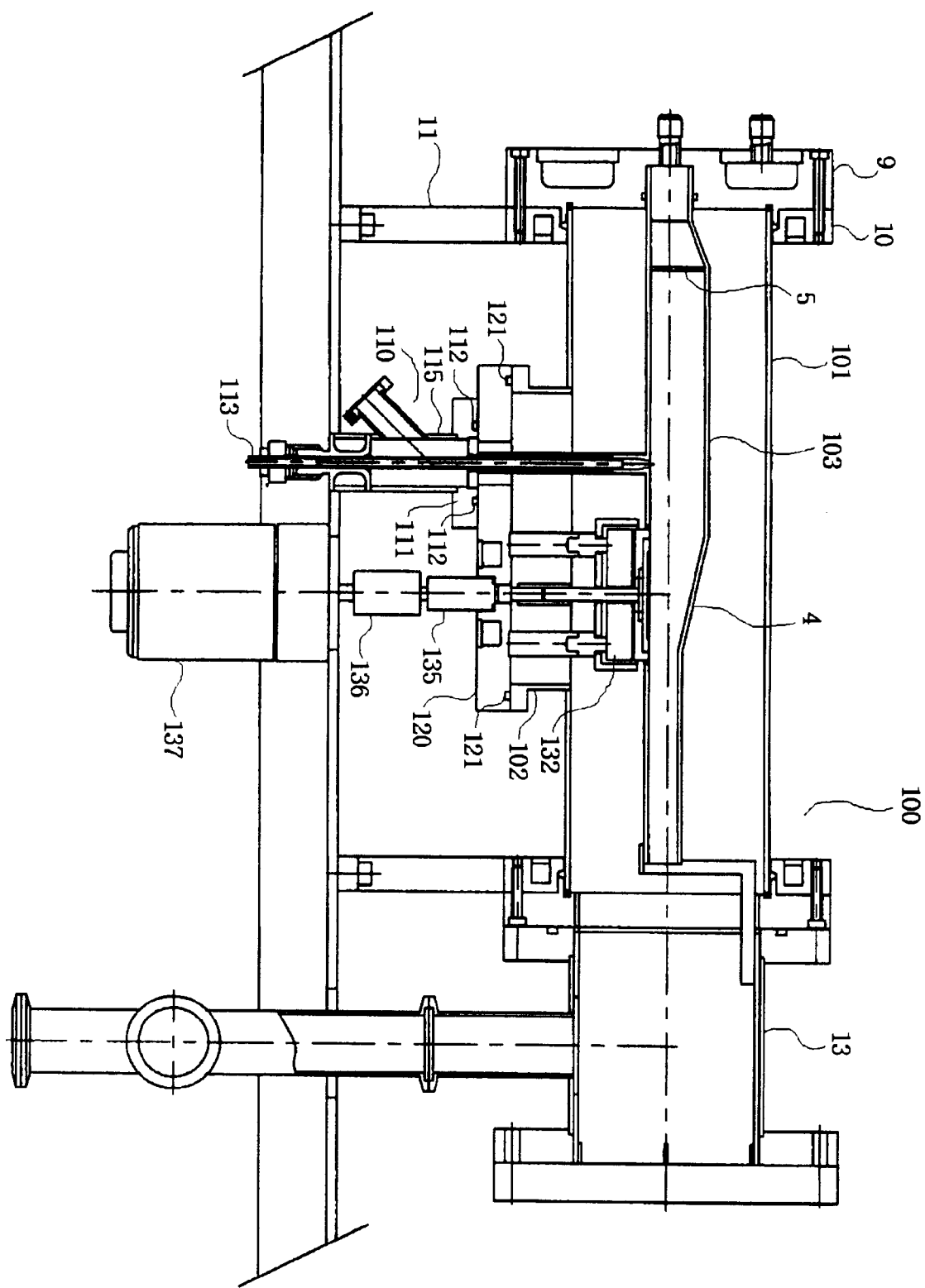
FIG. 12 is a sectional view of the reactor according to the second embodiment of the invention.

In the horizontal reactor 100 shown in FIG. 12, ammonia gas supply portion 110 and a base plate 120 for supporting susceptor 130 are fixed to a supporting plate 102 by bolts (not shown). Supporting plate 102 is shown projecting from the outer cell. Base plate 120 has grooves 120 to receive O-rings for creating a vacuum seal between supporting plate 102 and base plate 120.

Susceptor 130 on which substrate 17 is laid, is connected to the axis of rotating mechanism 135 of the ferrofluidic motor and fixed to the base plate by mechanism 135. Ammonia gas supply portion 110 is positioned through a hole 122 provided in base plate 120 and is fixed to the base plate by a vacuum flange 111 for the ammonia gas supply portion. Vacuum flange 111 is provided with grooves 112 to receive O-rings for forming a vacuum seal between vacuum flange 111 and base plate 120.

Figure 13:
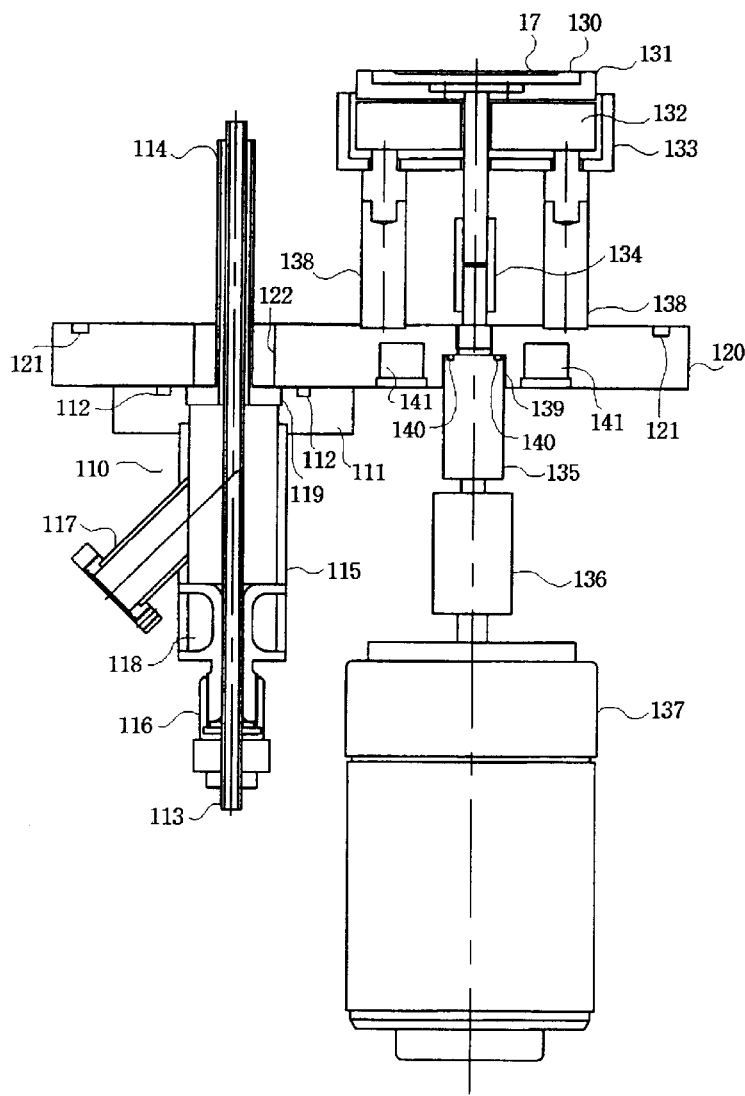
FIG. 13 is a sectional view showing the susceptor and the nitrogen supply portion of the second embodiment.
Figure 14:
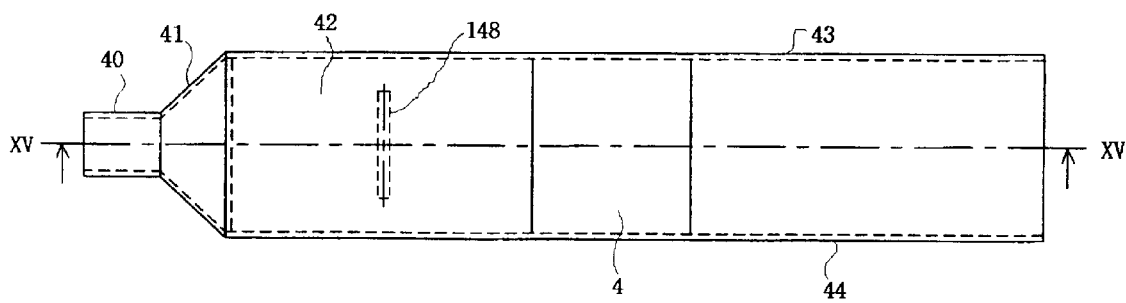
FIG. 14 is a plan view of the inner cell of the reactor of the second embodiment.
Figure 15:
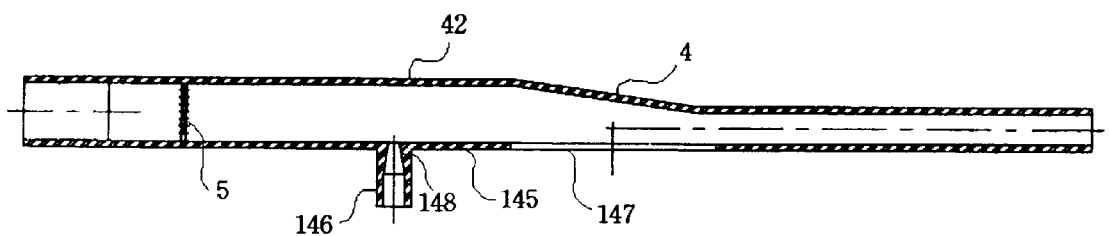
FIG. 15 is a sectional view of the inner cell taken along line XV—XV in FIG. 14.
Figure 16:
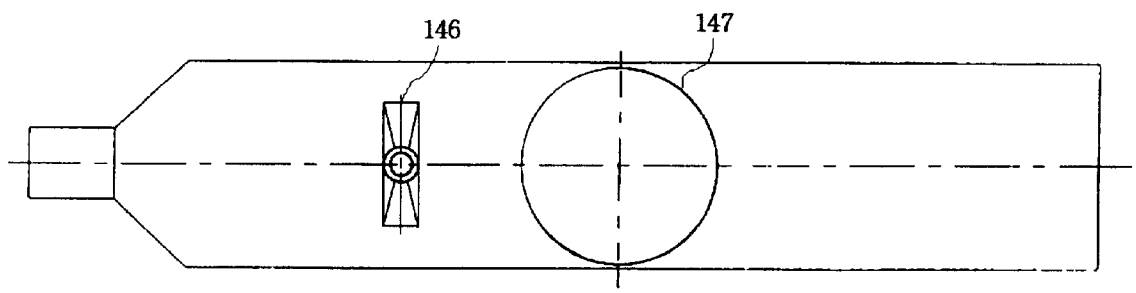
FIG. 16 is a bottom view of the inner cell of the second embodiment.
Figure 17:
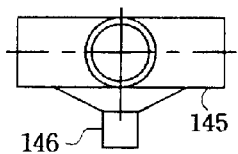
FIG. 17 is a side elevational view of the inner cell of the second embodiment viewed from the left side.
Figure 18:
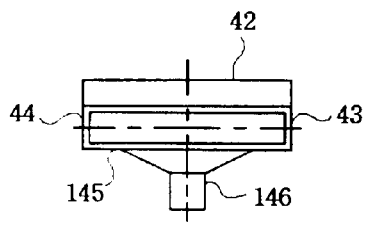
FIG. 18 is a side elevational view of the inner cell of the second embodiment viewed from the right side.

FIG. 13 illustrates the relationship between ammonia gas supply portion 110, suceptor 130 and base plate 120 of the second embodiment of the invention. Ammonia gas supply portion 110 consists of an ammonia gas tube 113, a tube-type heater surrounding the upper portion of the gas tube, a main body 115 surrounding the lower portion of the gas tube and a quick coupling seal 116 attached below main body 115 for vacuum sealing the ammonia gas tube from the surroundings. The main body has a feedthrough flange 117 attached to it and a water cooling jacket 118 within it to insulate quick coupling seal 116 from heat generated by the tube-type heater 114. The tube-type heater is connected to a heating tube support 119 in a flange type connection at its lower end. Support 119 has a larger thickness and diameter than the tube-type heater. The heating tube support is connected with a power line (not shown) of the heating tube, and transfers power from the power line to the heating tube, and insulates the surroundings from the high temperature heating tube. The power line of the heating tube is connected to a power source (not shown) outside the reactor through feedthrough flange 117. The main body is fixed to vacuum flange 111 by welding and the vacuum flange is fixed to base plate 120 by bolts (not shown). Both the vacuum flange and the base plate are made of stainless steel.

A PBN heater is used for heating tube 114. As it is possible to heat ammonia gas and the susceptor by separate heaters rather than one RF coil surrounding the outer cell, the outer cell can also be made of stainless steel.

The susceptor is made of graphite and coated with SiC. The susceptor has a recess for laying substrate on it. The susceptor is surrounded by a molybdenum plate 131 at its periphery and on its bottom surface. A plate-type heater 132 is located under the molybdenum plate with a gap. A PBN heater is used for plate-type heater 132. The molybdenum plate allows uniform heating of susceptor 130 by dispersing heat from plate-type heater 132. Heater 132 is surrounded by a reflecting plate 133 except at the portion facing the molybdenum plate. The reflecting plate efficiently focuses heat from the heater onto molybdenum plate 131 and avoids radiation to other portions of the reactor. The molybdenum plate is connected with the axis 134 of the rotating mechanism of ferrofluidic motor 135. The driving force to rotate the susceptor is transferred from motor 137 to molybdenum plate 131 through coupling 136, rotating mechanism 135 and axis 134. Heater 132 is supported by a supporter 138 fixed to the base plate 120. Rotating mechanism 135 is fixed to an NPT connection 139 by screws. Groove 140 is provided between the rotating mechanism and the NPT connection for receiving an O-ring for vacuum sealing. Water cooling jackets 141 are provided inside the base plate to protect O-rings from heat generated by the heater.

Referring again to FIG. 12, ammonia gas tube 113 is inserted into a tube-type injector 146 projecting from base wall 145 of inner cell 103. The-tube type heater abuts with the end of tube-type injector 146. Tube-type injector 146 is provided with a long groove 148 lateral to inner cell 103 at a portion which merges with base wall 145. Such arrangement enables nitrogen ions to flow into the reaction space of inner cell 103 with negligible leaks between the tube-type injector and tube-type heater 114. Ammonia gas is heated up to approximately 1,000° C. as it passes through tube-type heater 114 surrounding ammonia gas tube 113. As ammonia gas is heated, it decomposes to nitrogen ions which spray out of ammonia gas supply portion 110 and flow into the reaction space of the inner cell through tube-type injector 146. Nitrogen ions are mixed with reactant gases issuing from reactant gases supply portion 9, and the mixture forms a flow of source gases on substrate 17 as described for the first embodiment of the invention.

Susceptor 130 is positioned through a hole 147 in base wall 145 of inner cell 103 so that molybdenum plate 131, base wall 145 and substrate 17 are flush with one another. The gap between hole 147 and molybdenum plate 131 is tooled at about 1 mm depending on the ease of machining.

FIGS. 14–18 illustrate the inner cell 103 of the reactor of the second embodiment. Inner cell 103 of the second embodiment differs from that of the first embodiment in that it has a tube-type injector 146 connected with ammonia supply tube 113 instead of supporter 46 of inner cell 3 as in the first embodiment, and hole 147 for receiving susceptor 130 is located in base wall 145.

FIGS. 19–32 illustrate the third embodiment of the present invention. In the horozontal reactor for GaN semiconductor growth shown in FIG. 19, rotation of the susceptor is achieved by a gas flow through the susceptor. The gas is supplied from outside the reactor. The susceptor is heated by an RF heater 212 wound around the exterior of the outer cell as in the first embodiment.

The details on the horizontal reactor for GaN semiconductor growth of the third embodiment of the invention are provided below with reference to FIGS. 19–32. Components in common with the first and second embodiments are indicated by the same two-digit reference numerals added by 200 and their specific details are omitted below.

Figure 19:
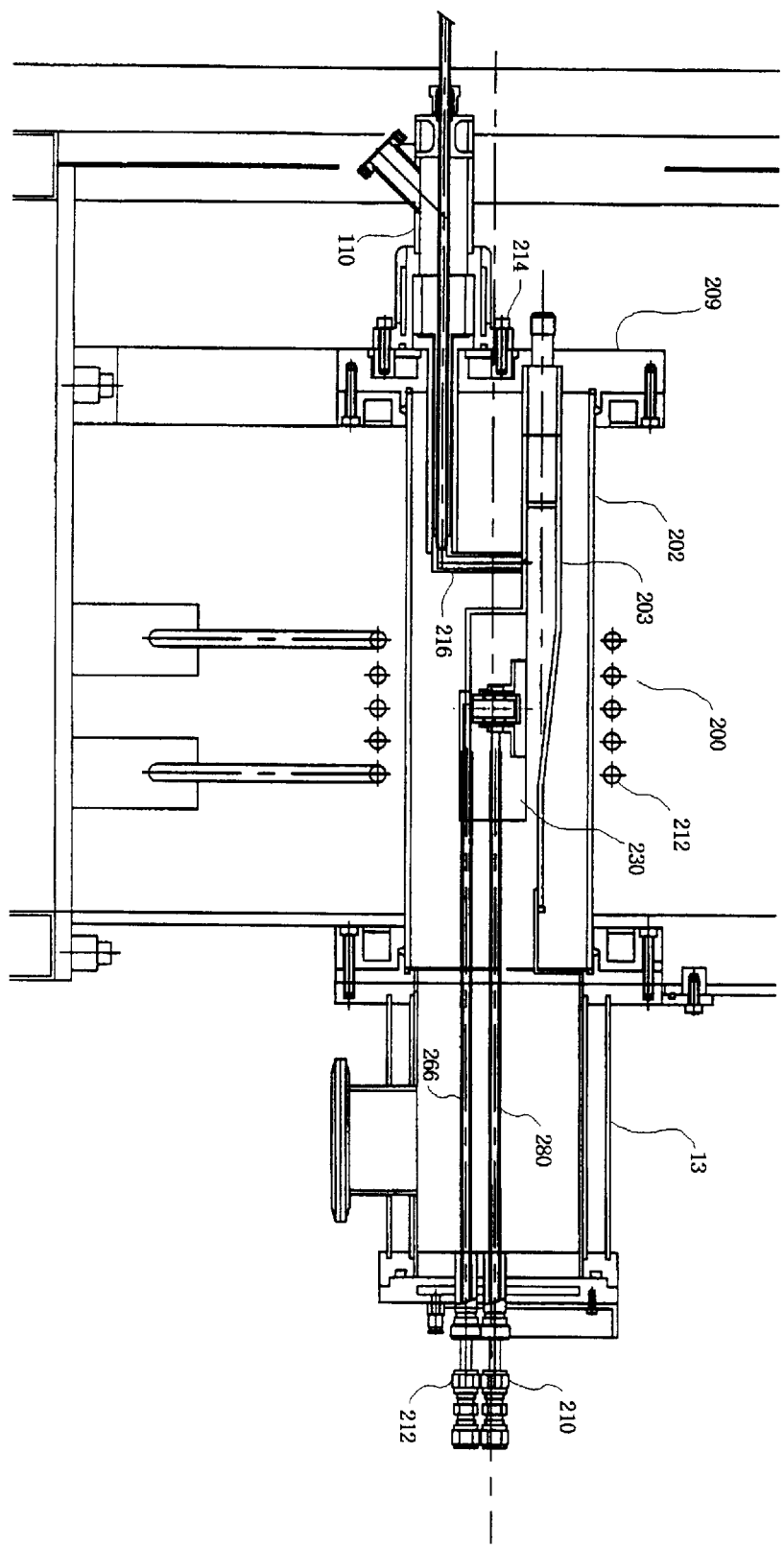
FIG. 19 is a sectional view of the reactor according to the third embodiment of the invention.
Figure 20:
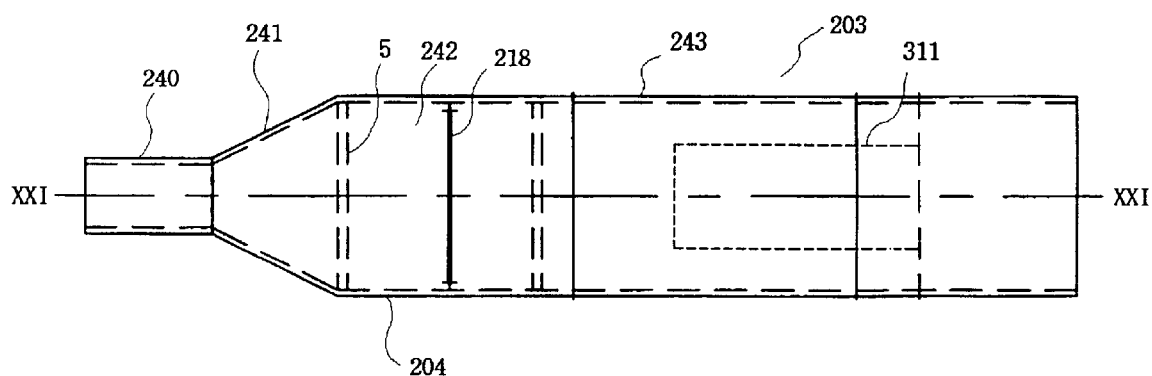
FIG. 20 is a plan view of the inner cell of the reactor of the third embodiment.
Figure 21:
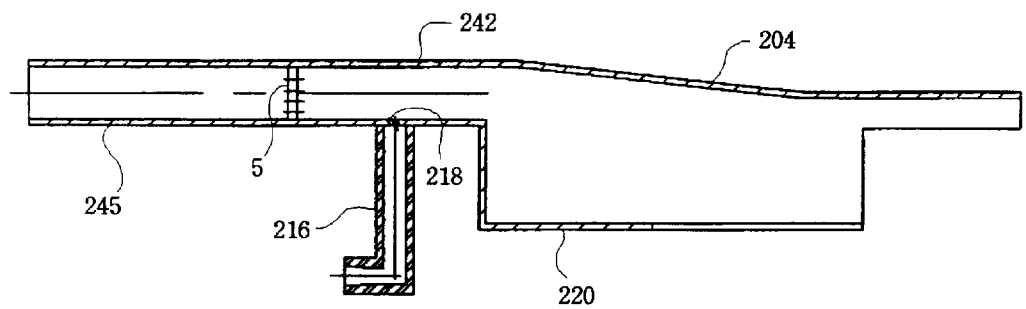
FIG. 21 is a sectional view of the inner cell taken along line XXI—XXI in FIG. 20.
Figure 22:
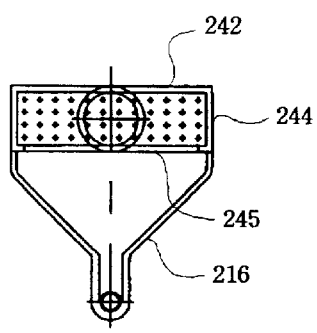
FIG. 22 is a side elevational view of the inner cell of the third embodiment viewed from the left side.
Figure 23:
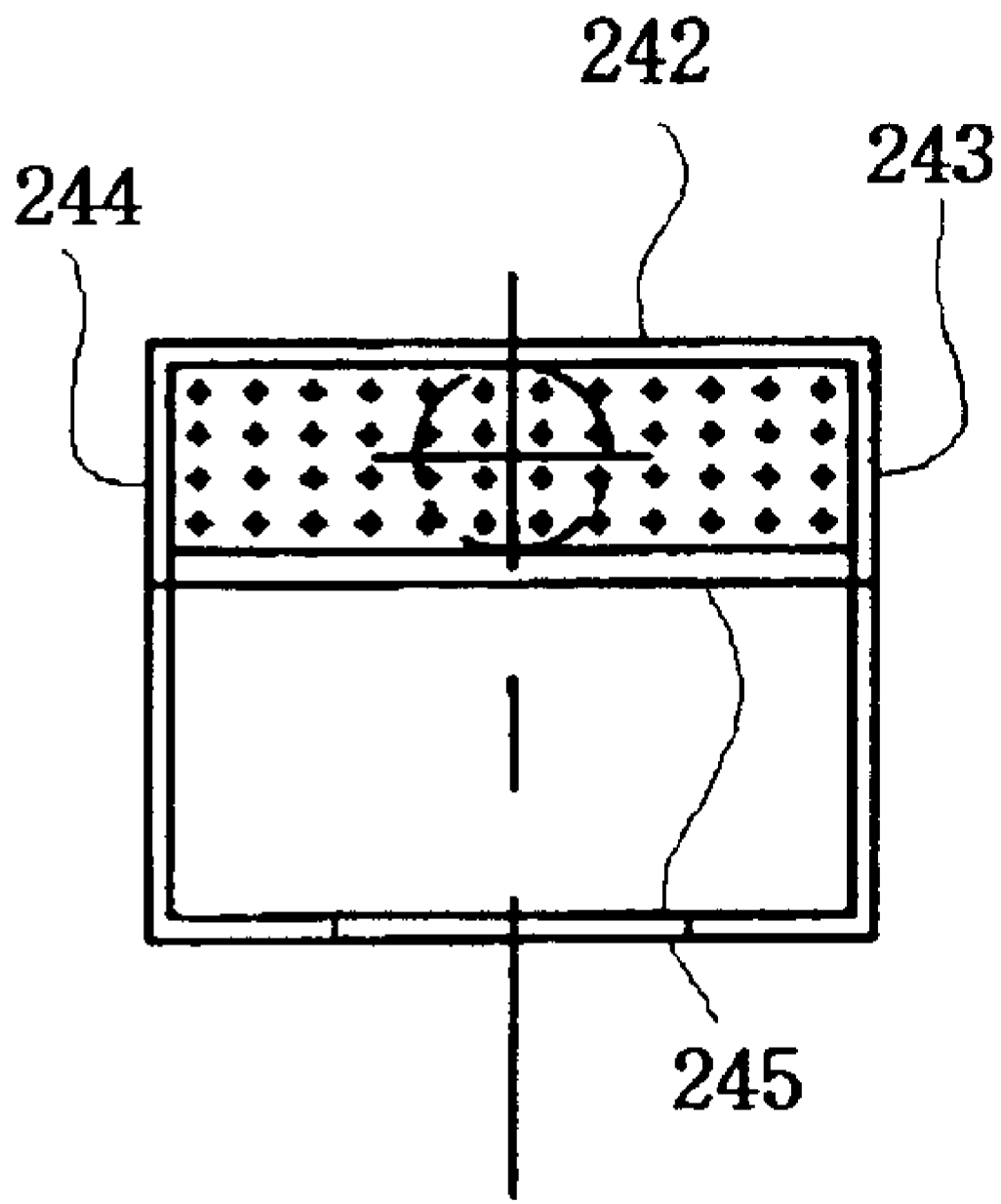
FIG. 23 is a side elevational view of the inner cell of the third embodiment viewed from the right side.

The horizontal reactor 200 for GaN semiconductor growth shown on FIG. 19 differs from the second embodiment in that the rotation of susceptor 230 is performed by flow of gas such as hydrogen gas supplied from outside reactor 200 through gas supply portions 210 and 212. Another difference is that the ammonia gas supply portion 110 is installed horizontal to reactant gases supply portion 209 with bolts, and heated ammonia gas supplied from ammonia gas supply portion 110 flows into the reaction space defined by inner cell 203 through a diffuser 216. Since the third embodiment does not employ a ferrofluidic power transmission, provisions for protection and installation of a ferrofluidic power transmission are not needed. In addition, as ammonia gas supply portion 110 is installed horizontally, there is no need to provide an opening in outer wall 202 for installing the ammonia gas supply portion. Consequently, the structure of the reactor becomes simple and easier to manufacture.

FIGS. 20–23 show the inner cell 203 of the third embodiment. Inner cell 203 has a slit 218 through which ammonia gas flowing out of diffuser 216, flows into the reaction space. Slit 218 is positioned near shower head 5. A susceptor receiving portion 220 for receiving susceptor 230 is provided between slit 206 and the exit for inner cell 203, and opposite inclined portion 4.

Figure 24:
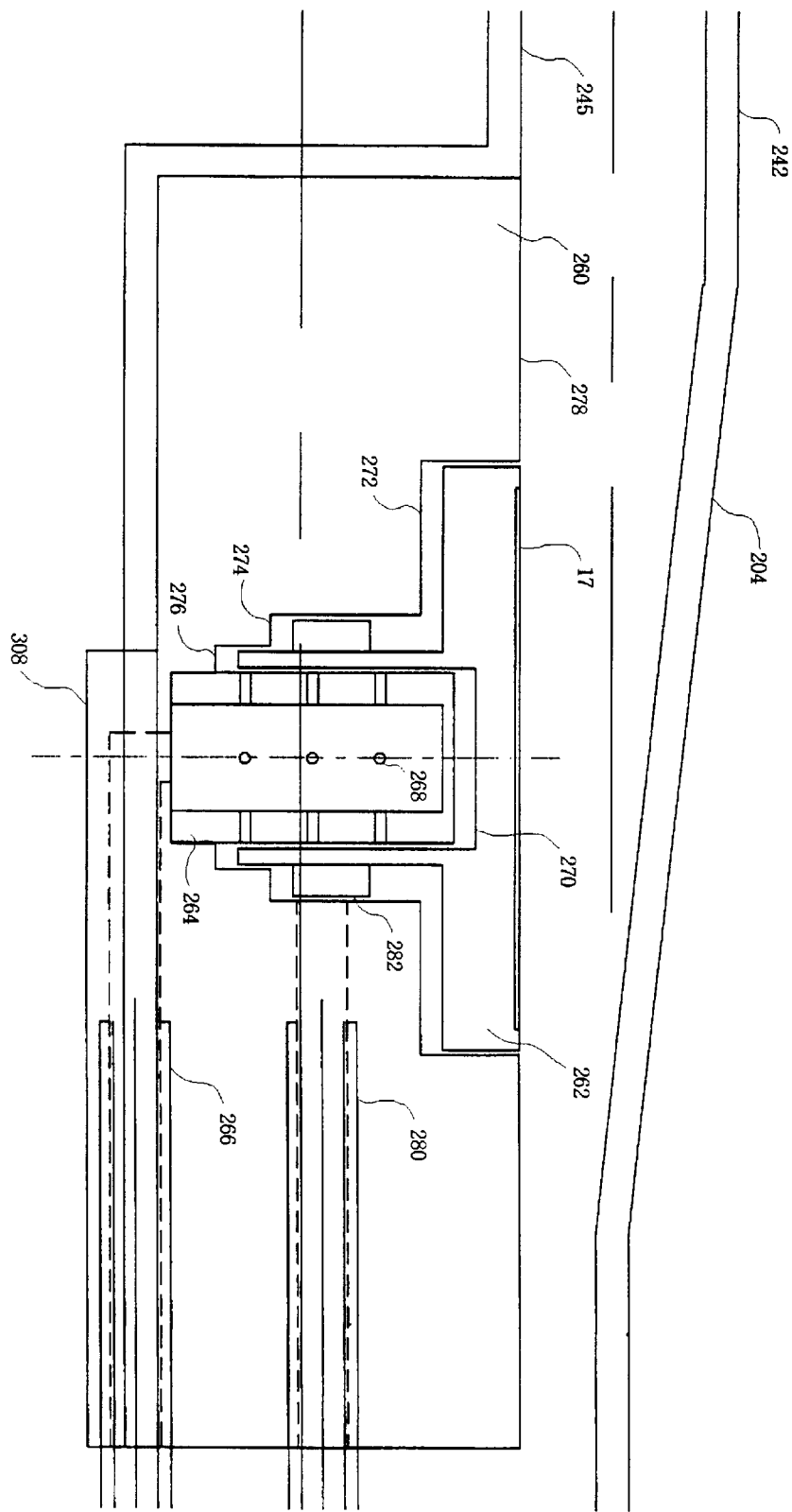
FIG. 24 is an enlarged sectional view of the susceptor of the third embodiment installed in the inner cell and connected with the gas supply portion.

Referring to FIG. 24, details on the rotating operation of susceptor 230 is provided. Susceptor 230 includes a susceptor block 260, a rotating portion 262 and a central cylindrical portion 264, which are explained in more detail below with reference to FIGS. 25–27. Pressurized hydrogen gas is supplied from gas supply portion 212 through a gas supply tube 266 connected to the bottom of central cylindrical portion 264. The hydrogen gas is ejected through holes 268 provided in the cylindrical wall of central cylindrical portion 264, and flows into the gap between central cylindrical portion 264 and a recess 270 of rotating portion 262 which surrounds central cylindrical portion 264. The hydrogen gas exerts a pressure on the surface of recess 270 so that the rotating portion is lifted from a resting postition, at which rotating portion 262 rested on a step 272 of susceptor block 260, to an operating position in which substrate 17 is laid on rotating portion 262 and flush with base wall 245 and the upper surface of susceptor block 260. This lifting operation using hydrogen gas flow may be controlled by controlling the flow rate of the hydrogen gas through gas supply tube 266, with a mass flow controller (MFC, not shown).

When rotating portion 262 is lifted to the operating position, hydrogen gas from gas supply portion 210 flows into the gap between susceptor block 260 and rotating portion 262 through a gas supply tube 280. The introduced hydrogen gas impacts on wings 282 provied on the lower periphery of rotating portion 262 thereby moving the rotating portion. The rotating speed of rotating portion 262 may be controlled by controlling the flow rate of the hydrogen gas through gas supply tube 280 with an MFC (not shown). The in-coming hydrogen gas is exhausted through outlet holes 284 and 286 provided on a step of susceptor block 260 and does not flow into the reaction space defined by inner wall 203 and susceptor 230. After completion of epitaxial thin film growth, gas flow rates through gas supply tubes 266 and 280 are controlled so that the movement of rotating portion 262 is stopped and the rotating portion 262 is lowered to the resting position on step 272 of susceptor block 260.

Figure 25:
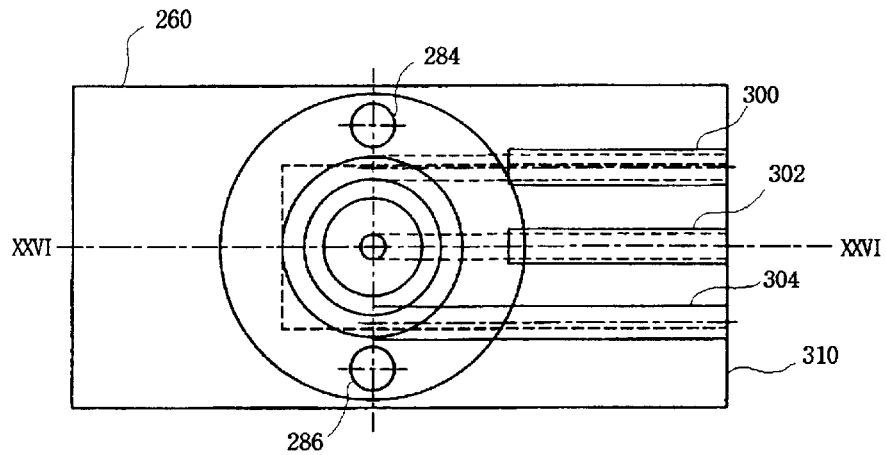
FIG. 25 is a plan view of the susceptor block of the third embodiment.
Figure 26:
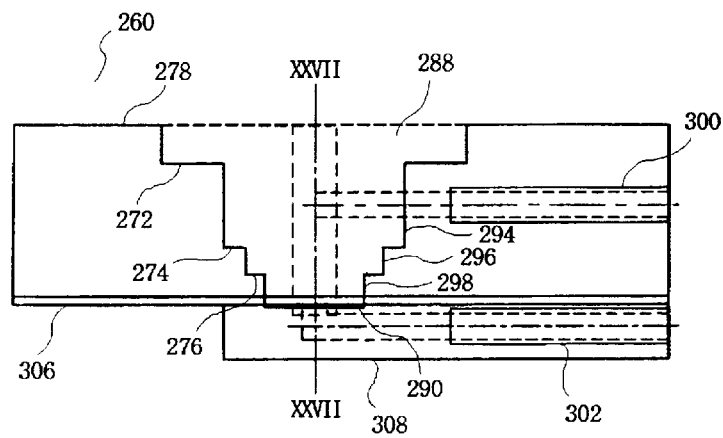
FIG. 26 is a sectional view of the susceptor block taken along line XXVI—XXVI in FIG. 25.
Figure 27:
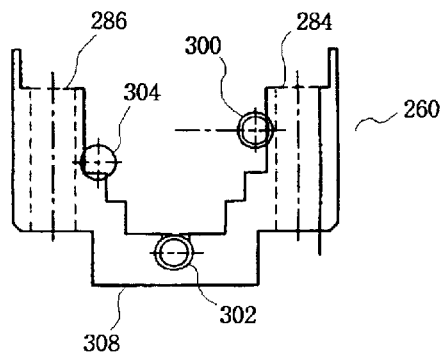
FIG. 27 is a sectional view of the susceptor block taken along line XXVII—XXVII in FIG. 26.

Details on susceptor block 260 is provided with reference to FIGS. 25–27. Block 260 is generally a retangular cube made of graphite and coated with SiC. A recess 288 for receiving rotating portion 262 and central cylindrical portion 264 is provided around the center of the upper surface 278 of the block. Recess 288 includes steps 272, 274 and 276 concentrically arranged from upper surface 278 to the bottom 290 of recess 288 and circular walls 292, 294, 296 and 298 between the steps. Each step is of a suitable size and in a suitable position to support rotating portion 262. The lower surface 306 of block 260 is provided with a hole 302 extending longitudinal to the block for receiving gas supply tube 266, and a projection 308 surrounding hole 302. One end of hole 302 opens at a side surface of susceptor block 260 and the other end opens perpendicular to the longitudal axis of hole 302 at the center of bottom 290. When susceptor 230 is loaded into inner cell 203, projection 308 is fitted in a cut-out portion 311 provided in the susceptor receiving portion 220 of inner cell 203. A hole 300, extending longitudinal to the block, for receiving gas supply tube 280 is provided ajacent circular wall 294 of susceptor block 260. One end of hole 300 is opens at the side surface 310 of susceptor block 260 and the other end opens in wall 294 of the recess. In addition, a hole 304 which extends longitudinal to the block, is provided at a position opposite hole 300 with respect to the centerline of susceptor block 260. One end of hole 304 opens at side surface 310 of susceptor block 260 and the other end opens at a position where wall 294 and step 274 of the recess, meet. A quartz pipe (not shown) similar to gas supply tubes 266 and 280 is inserted into hole 304 and performs the role of supporting susceptor 230 together with gas supply tube 266 and 280 when susceptor 230 is loaded into or unloaded from reactor 200, and is adapted to receive a thermocouple (not shown) to measure the temperature of the susceptor.

Figure 28:
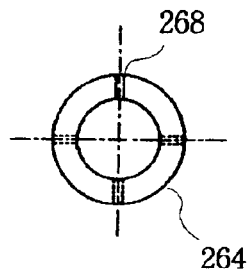
FIG. 28 is a plan view of the central stationary portion of the susceptor of the third embodiment.
Figure 29:
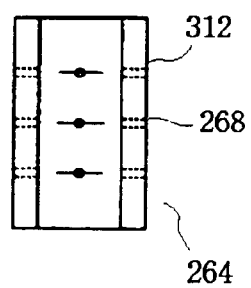
FIG. 29 is an elevational view of the central stationary portion of the susceptor of the third embodiment.

The details on the central cylindrical portion 264 of susceptor 230 is provided with reference to FIGS. 28 and 29. Central cylindrical portion 264 is made of graphite and coated with SiC. Central cylindrical portion 264 has a shape of a hollow cylinder, one end of which is blind and the other end of which is open. The open end of central cylindrical portion 264 is fixed to bottom 290 of recess 288 with bolts and the like (not shown). A plurality of through holes 312 are uniformly distributed on the cylindrical wall of central cylindrical portion 264. Hydrogen gas supplied through gas supply tube 266, flows past the space defined by the inside of central cylindrical portion 264 and bottom 290 of recess 288 of susceptor block 260 and is exhausted through holes 312.

Figure 30:
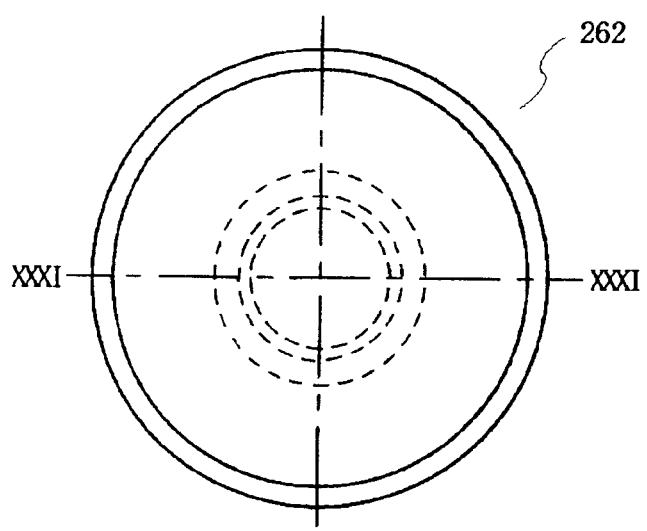
FIG. 30 is a plan view of the rotating portion of the susceptor of the third embodiment.
Figure 31:
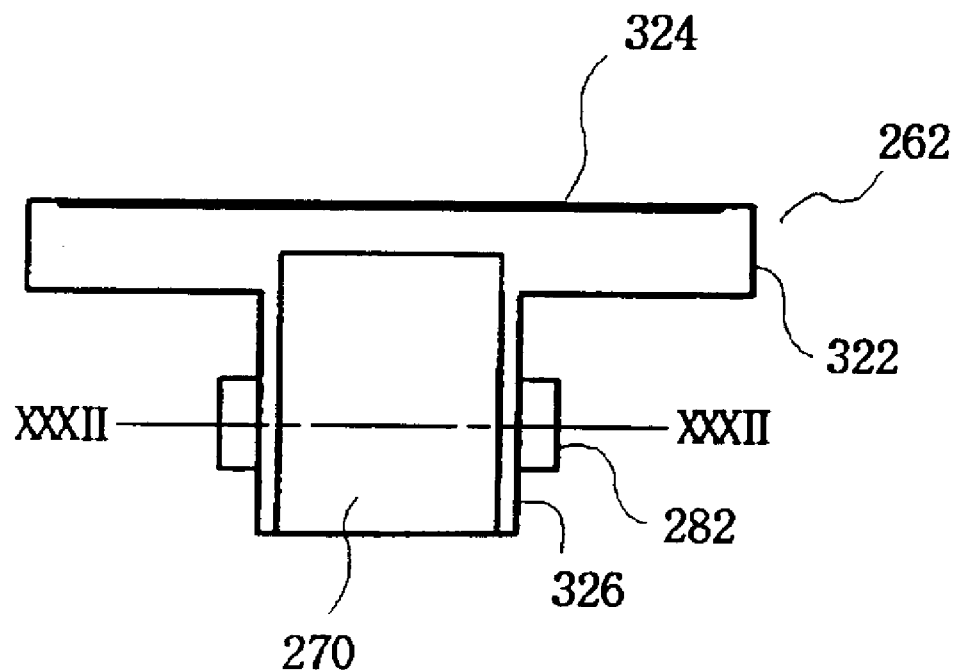
FIG. 31 is a sectional view of the susceptor block taken along line XXXI—XXXI in FIG. 30.
Figure 32:
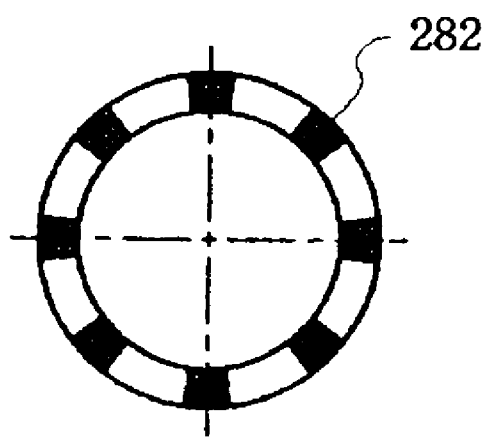
FIG. 32 is a sectional view of the susceptor block taken along line XXXII—XXXII in FIG. 31.

Details on the rotating portion 262 of susceptor 230 is provided with reference to FIGS. 30–32. Rotating portion 262 is made of graphite and coated with SiC. Rotating portion 262 includes a main body 322, a recess 324 provided on the upper surface of main body 322 for holding substrate 17, and a hollow cylindrical portion 326 which extends downwardly from the lower surface of main body 322. The hollow space inside hollow cylindrical portion 326 defines recess 270 which surrounds central cylindrical portion 264. The plurality of wings 282 are uniformly arranged on the outer periphery of hollow cylindrical portion 326.

The horizontal reactor embodiments described herein eliminate thermal convection from source gases flowing over a susceptor and, at the same time, induces uniform laminar flow of the source gases over the substrate, which contribute to the production of a high quality epitaxial layer.

Various modifications and alterations to the present invention may be appreciated based on a review of this disclosure. These changes and additions are intended to be within the scope and spirit of this invention as defined by the following claims.

What is claimed is:

1. A horizontal reactor for compound semiconductor growth, comprising:

(a) a susceptor adapted to hold a substrate on which a thin film for a semi-conductor grows;

(b) an inner cell having an upper wall, a base wall, and side walls; said upper wall, said base wall and said side walls defining a reactant gas passage having two open ends; said upper wall having an inclined portion deriving laminar flow of reactant gases in a mid section of said upper wall; said base wall supporting said susceptor in a position opposite to said inclined portion;

(c) an outer cell surrronding said inner cell;

(d) an ammonia supply means for supplying ammonia gas to said reactant gas passage;

(e) a reactant gas supply means communicating with a first end of said two open ends of said reactant gas passage and for supplying reactant gases except ammonia gas to said reactant gas passage;

(f) a reactant gas vent means communicating with the second end of said two ends of said reactant gas passage and exhausting reactant gases out of said reactant gas passage;

(g) an ammonia gas heating means for heating ammonia gas, and (h) a susceptor heating means for heating said susceptor.

2. The horizontal reactor of claim 1, wherein said reactor further comprises a susceptor rotating means for rotating said susceptor.

3. The horizontal reactor of claim 2, wherein said ammonia heating means and said susceptor heating means are RF coil heaters;

said susceptor having a rotating portion which holds said substrate and is rotated by said susceptor rotating means and a stationary portion which surrounds said rotating portion;

said ammonia supply means having an ammonia supply tube, one end of which is open at a position adjacent said rotating portion of said susceptor, said ammonia supply tube adapted to be installed through said stationary portion of said susceptor so that it is heated as said stationary portion is heated.

4. The horizontal reactor of claim 3, wherein a long groove extends around said substrate on an upper surface of said stationary portion of said susceptor, and said one end of said ammonia supply tube is connected to said groove.

5. The horizontal reactor of claim 2, wherein said susceptor rotating means comprises a ferrofluidic power transmission which connects said susceptor to a susceptor driving motor.

6. The horizontal reactor of claim 2, wherein said ammonia supply means has an ammonia supply tube, one end of which is open at a position of said base wall of said inner cell adjacent said susceptor;

said ammonia heating means comprises an electric resistance heater surrounding said ammonia supply tube and said susceptor heating means comprises an electric resistance heater positioned below said susceptor.

7. The horizontal reactor of claim 6, wherein said inner cell has a tube-type injector which projects downwardly from said base wall of said inner cell and receives said ammonia supply tube; said tube-type injector has a long groove which extends perpendicular to the longitudinal axis of said inner cell at the portion of said injector at which said injector meets with said base wall of said inner cell.

8. The horizontal reactor of claim 1, wherein said reactor further comprises a first gas supply means and a second gas supply means which supply gas to said susceptor;

said susceptor has a susceptor block supported on said base wall of said inner cell, a central cylindrical portion and a rotating portion;

said susceptor block is provided with a recess adapted to receive said rotating portion and said central cylindrical portion, a first gas supply tube through which flows gas supplied from said first gas supply means, a second gas supply tube through which flows gas supplied from said second gas supply means, and outlets exhausting said gases;

said central cylindrical portion is in the shape of a hollow cylinder having an open end fixed to a bottom of said recess, and is provided with a plurality of through holes;

said rotating portion having a main body adapted to hold said substrate, a hollow cylindrical portion extending downwards from the lower surface of said main body, said hollow cylindrical portion having a plurality of wings arranged on its outer periphery;

said first gas supply tube is connected to said bottom of said recess so that gas supplied through said first gas supply tube fills the space defined by said bottom of said recess and the inside of said central cylindrical portion and flows into a gap between said central cylindrical portion and said hollow cylindrical portion of said rotating portion through said plurality of through holes so that said gas from said first gas supply tube flow exerts a pressure against the surface of said hollow cylindrical portion to lift said rotating portion; and said second gas supply tube is connected to a wall of said recess so that gas supplied through said second gas supply tube flows into a space between said hollow cylindrical portion of said rotating portion and said recess of said susceptor block so that said gas from said second gas supply tube impacts against said wings to rotate said rotating portion.

* * * * *

UNITED STATES PATENT AND TRADEMARK OFFICE
CERTIFICATE OF CORRECTION

PATENT NO.    : 6,214,116 B1
DATED         : April 10, 2001
INVENTOR(S)   : Hyun Shin It is certified that error appears in the above-identified patent and that said Letters Patent is hereby corrected as shown below:

Title page,
Item [56], References Cited, OTHER PUBLICATIONS, "Shuji Nakamura et al … etc.," and "Tomohiro Nakimori … etc." (second occurrence) should be deleted Column 1,
Line 15, "extendeded" should read -- extended --.
Line 24, "AIN" should read -- "AlN" --
Line 45, "suceptors" should read -- susceptors --.

Column 2,
Lines 7-8, "surrronding" should read -- ounding --
Line 18, "comnprises" should read -- comprises --

Column 3,
Line 21, "suceptor" should read -- suscpetor --
Lines 30 and 32, "suceptor" should read -- susceptor --

Column 4,
Line 50, "proceses" should read -- processes --

Column 6,
Line 13, "suceptor" should read -- susceptor --
Line 65, "are heated" should read -- are each heated --

Column 7,
Line 30, "suceptor" should read -- susceptor --
Lines 53 and 62, "PBN" should read -- PbN --

Column 8,
Lines 9 and 10, "NPT" should read -- National Pipe Thread --
Line 45, "horozontal" should read -- horizontal --

Column 9,
Line 16, "is" should read -- are --
Line 28, "postition" should read -- position --
Line 40, "provied" should read -- provided --
Line 55, "is" should read -- are --
Line 56, "retangular" should read -- rectangular --

UNITED STATES PATENT AND TRADEMARK OFFICE
CERTIFICATE OF CORRECTION

PATENT NO. : 6,214,116 B1
DATED : April 10, 2001
INVENTOR(S) : Hyun Shin

It is certified that error appears in the above-identified patent and that said Letters Patent is hereby corrected as shown below:

Column 10,
Line 2, "longitudal" should read -- longitudinal --
Line 8, "ajacent" should read -- adjacent --
Lines 23 and 37, "is" should read -- are --
Line 50, "induces" should read -- induce" --

Column 11,
Line 4, "surrrounding" should read -- surrounding --
Line 17, "gas," should read -- gas; --

Signed and Sealed this

Nineteenth Day of November, 2002

*Attest:*

JAMES E. ROGAN
*Director of the United States Patent and Trademark Office*

*Attesting Officer*